US011157421B2

(12) United States Patent
Zhu et al.

(10) Patent No.: US 11,157,421 B2
(45) Date of Patent: Oct. 26, 2021

(54) SYSTEM LEVEL INTEGRATED CIRCUIT CHIP

(71) Applicant: Gowin Semiconductor Corporation, GuangZhou (CN)

(72) Inventors: Jinghui Zhu, San Jose, CA (US); San-Ta Kow, Foshan (CN); Tun Jun Gao, Foshan (CN); Diwakar Chopperla, Fremont, CA (US); Chienkuang Chen, Foshan (CN); Ning Song, Cupertino, CA (US)

(73) Assignee: GOWIN Semiconductor Corporation, GuangZhou (CN)

( * ) Notice: Subject to any disclaimer, the term of this patent is extended or adjusted under 35 U.S.C. 154(b) by 0 days.

(21) Appl. No.: 15/857,672

(22) Filed: Dec. 29, 2017

(65) Prior Publication Data

US 2019/0114268 A1    Apr. 18, 2019

(30) Foreign Application Priority Data

Oct. 18, 2017 (CN) .......................... 201710969935.4

(51) Int. Cl.
*G06F 13/10* (2006.01)
*H03K 19/177* (2020.01)
(Continued)

(52) U.S. Cl.
CPC ........ *G06F 13/102* (2013.01); *G06F 12/0638* (2013.01); *G06F 13/12* (2013.01);
(Continued)

(58) Field of Classification Search
CPC ............ G06F 17/5054; G06F 17/5068; G06F 15/7867; G06F 17/5045
(Continued)

(56) References Cited

U.S. PATENT DOCUMENTS 5,761,516 A * 6/1998 Rostoker ............... G06F 9/4812
709/201
6,260,087 B1 * 7/2001 Chang ................ H03K 19/1736
326/39

(Continued)

*Primary Examiner* — Faisal M Zaman
(74) *Attorney, Agent, or Firm* — James M. Wu; JW Law Group

(57) ABSTRACT

The present application discloses a system level integrated circuit chip, comprising a fixed logic module and a Programmable Logic Module; the fixed logic module comprising a CPU module, a non-volatile memory module, a high speed data transmission module, an analogue-to-digital and/or digital-to-analogue conversion module; the Programmable Logic Module comprising a user-defined field programmable gate array and a programmable control module; the CPU module is interconnected with the user-defined field programmable gate array and the programmable control module; the non-volatile memory is interconnected with the user-defined field programmable gate array and the programmable control module; the analogue-to-digital and/or digital-to-analogue conversion module are connected with the user-defined field programmable gate array; and the high speed data transmission module is interconnected with the user-defined field programmable gate array. The present application solves the problem of the combination of a variety of different devices and the integration of processing capabilities with different applications.

20 Claims, 1 Drawing Sheet

(51) Int. Cl.
*G06F 12/06* (2006.01)
*G06F 13/42* (2006.01)
*G06F 13/12* (2006.01)

(52) U.S. Cl.
CPC ....... *G06F 13/4282* (2013.01); *H03K 19/177* (2013.01); *G06F 2212/205* (2013.01)

(58) Field of Classification Search
USPC ...... 326/39, 41, 38; 716/117, 106, 116, 119; 710/69, 104, 100
See application file for complete search history.

(56) References Cited

U.S. PATENT DOCUMENTS

| | | | | |
|---|---|---|---|---|
| 6,747,479 B1* | 6/2004 | Coppola | ......... | H03K 19/17732 326/39 |
| 7,299,427 B2* | 11/2007 | Settles | ................. | G06F 11/261 703/16 |
| 7,362,135 B1* | 4/2008 | Chang | ................. | G06F 17/5054 326/41 |
| 7,970,859 B2* | 6/2011 | Weinstock | ............ | G06F 3/1462 345/519 |
| 8,981,813 B2* | 3/2015 | Chan | ............. | H03K 19/017581 326/39 |
| 9,934,173 B1* | 4/2018 | Sakalley | ............ | G06F 13/1673 |
| 2002/0045952 A1* | 4/2002 | Blemel | ................ | G05B 19/042 700/2 |
| 2005/0040850 A1* | 2/2005 | Schultz | .............. | G06F 15/7867 326/41 |
| 2006/0094461 A1* | 5/2006 | Hameed | ................. | G06F 3/038 455/552.1 |
| 2007/0271612 A1* | 11/2007 | Fang | .................... | G06F 21/554 726/22 |
| 2008/0146260 A1* | 6/2008 | Rofougaran | ........... | H04B 1/406 455/466 |
| 2012/0314817 A1* | 12/2012 | Katou | ................... | G06F 1/3209 375/340 |
| 2013/0019213 A1* | 1/2013 | Panofsky | ............ | G06F 17/5054 716/101 |
| 2014/0160140 A1* | 6/2014 | Prabakaran | ........... | G09G 5/008 345/560 |
| 2015/0048425 A1* | 2/2015 | Park | ................. | H01L 27/11807 257/211 |
| 2015/0347324 A1* | 12/2015 | Tsuji | ................... | G06F 13/1663 711/152 |
| 2016/0021430 A1* | 1/2016 | LaBosco | ........... | H04N 21/4367 725/31 |
| 2016/0036428 A1* | 2/2016 | Wang | ............... | H03K 19/17772 327/437 |
| 2016/0077577 A1* | 3/2016 | Van Lunteren | ..... | G06F 15/7821 711/154 |
| 2016/0124899 A1* | 5/2016 | Vasishta | ............. | G06F 15/7807 712/35 |
| 2016/0179071 A1* | 6/2016 | Chandra | ................. | G06F 1/206 700/10 |
| 2016/0274816 A1* | 9/2016 | Zhu | ....................... | G06F 13/102 |
| 2017/0012796 A1* | 1/2017 | Velasco | ............. | H04N 21/4402 |
| 2017/0078082 A1* | 3/2017 | Kao | ..................... | H04N 7/22 |
| 2017/0111295 A1* | 4/2017 | Snowdon | ............. | H04L 12/413 |
| 2017/0310340 A1* | 10/2017 | Schulz | ................. | H04L 1/1829 |
| 2018/0011803 A1* | 1/2018 | Kow | .................... | G06F 3/0619 |
| 2018/0192075 A1* | 7/2018 | Chambers | ............. | H04N 19/88 |

* cited by examiner

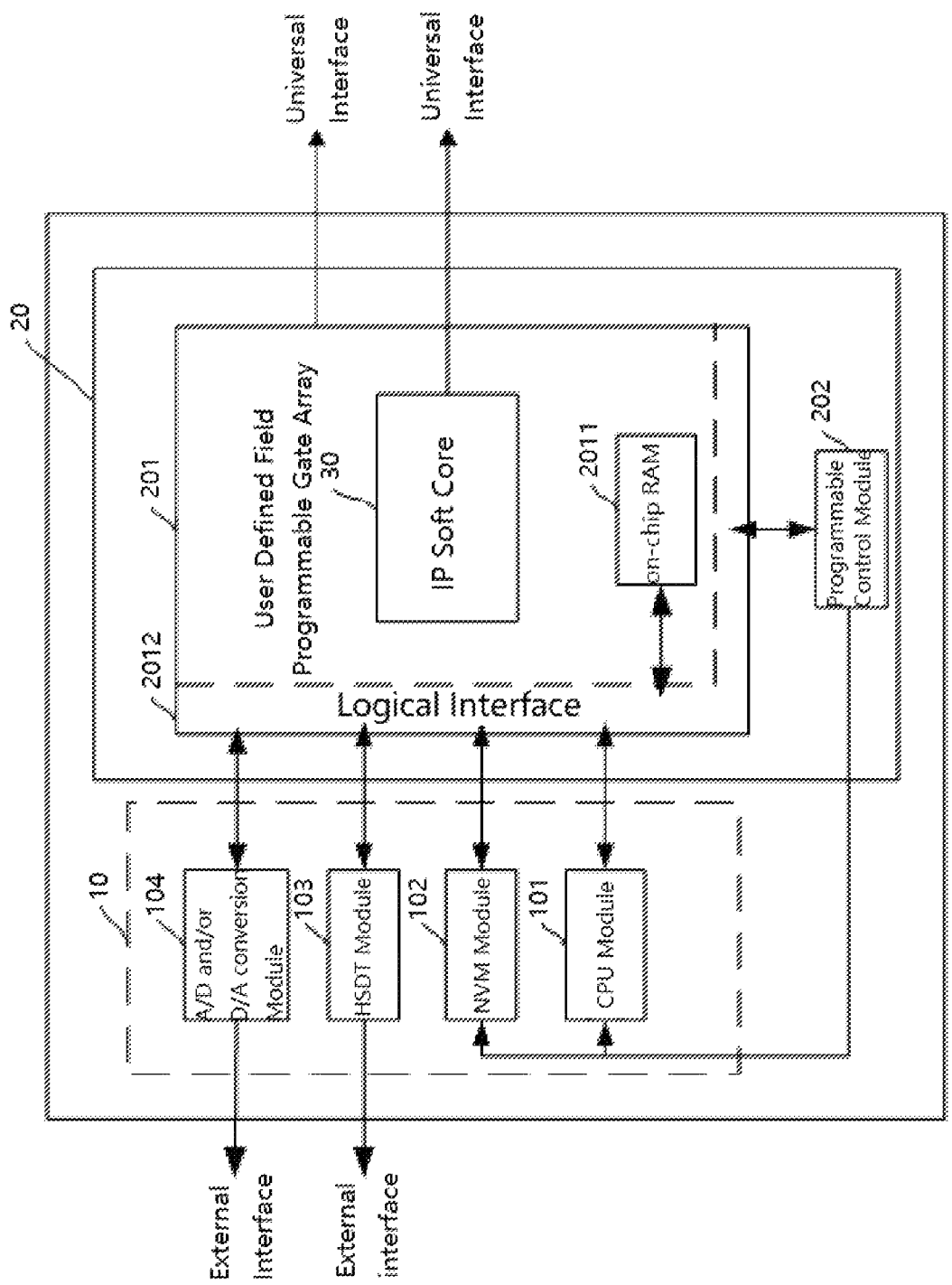

SYSTEM LEVEL INTEGRATED CIRCUIT CHIP

CROSS-REFERENCE TO RELATED APPLICATION

The present application claims priority to Chinese patent application No. 201710969935.4 filed on Oct. 18, 2017, the whole disclosure of which is incorporated herein by reference.

FIELD OF THE INVENTION

The present application belongs to the field of integrated circuit design, and in particular, refers to a system level integrated circuit chip.

BACKGROUND OF THE INVENTION

With the widespread application of large scale integrated circuit technology, more and more applications require a combination of the large-scale integrated data processing function of Central Processing Units with the superb ability of Programmable Logic Devices for different applications, so as to form System on Chips (SOCs) with a variety of different functions to solve problems.

The so called Central Processing Unit, which is capable of fetching instruction, executing instruction, and exchanging information with outside memory and logical unit and so on, is the operation control part of a microcomputer.

The so called logic devices can be divided into Fixed Logic Devices and Programmable Logic Devices. Circuits in the Fixed Logic Devices are permanent, once produced, the Fixed Logic Devices perform one or a group of functions that cannot be changed. Programmable Logic Devices are standard finished products that provide customers a wide range of logic capabilities, features, speeds, and voltage characteristics, and such devices can be changed at any time to accomplish many different functions. The two main types of Programmable Logic Devices are Field Programmable Gate Array (FPGA) and complex Field Programmable Logic Device (cPLD). Among them, the programmable logic device FPGA provides the highest logic density, the most abundant features and the highest performances, the Programmable Logic Devices can provide customers a wide variety of logic capabilities, features, speeds and voltage characteristics, etc., and such devices can be changed at any time.

SUMMARY OF THE INVENTION

An object of the present application is to provide a system level integrated circuit chip, which is capable of embedding a Central Processing Unit and a user defined field programmable gate array in a single chip and combining a desired external function module such as a non-volatile memory module to achieve the system-on-chip features required by a particular application.

The present application is implemented as follows: the present application provides a system level integrated circuit chip that comprises a fixed logic module and a Programmable Logic Module;

The fixed logic module comprises a CPU module, a non-volatile memory module, a high speed data transmission module, an analogue-to-digital conversion and/or a digital-to-analogue conversion module;

The Programmable Logic Module comprises a user defined field programmable gate array and a programmable control module. The user defined field programmable gate array comprises an IP soft core based on hardware description language, on-chip Random Access Memory, and logical interface;

The CPU module is interconnected with the user defined field programmable gate array and the programmable control module;

The non-volatile memory is interconnected with the user defined field programmable gate array and the programmable control module;

The analogue-to-digital conversion and/or the digital-to-analogue conversion module are interconnected with the user defined field programmable gate array and an external pin;

The high speed data transmission module is interconnected with the user defined field programmable gate array and the external pin.

An embodiment of the present application provide a system level integrated circuit chip, which is capable of embedding a fixed logic module, a Programmable Logic Module and an IP soft core in a single chip, using a special and excellent architecture of the combination of a high-performance CPU module and a programmable logic device, provides an effective and convenient solution, dealing with the problem of the combination of a variety of different devices and the integration of the processing capabilities with different applications. The present application provides direct help in opening up new integrated circuit markets, ensures more high-speed, more flexible and lower-power information transmissions among integrated circuits in various applications. The present application improves the flexibility of user design, and achieves the goal of reducing power consumption, reducing physical interfaces, achieving high-speed transmission and reducing the interconnection cost between integrated circuits.

BRIEF DESCRIPTION OF THE DRAWINGS

To better describe the technical solutions in the embodiments of the present application, following is a brief interdiction to the drawings required for describing the embodiments or the prior art. Apparently, the drawings in the following description show merely some embodiments of the present application, those skilled in the art can obtain other drawings according to the following drawings without creative work.

The FIGURE is a schematic view of a system level integrated circuit chip provided by an embodiment of the present application.

DETAILED DESCRIPTION OF THE PREFERRED EMBODIMENT

In order to make the purposes, technical solutions, and advantages of the present application be clearer, the present application will be further described in detail hereinafter with reference to accompany embodiments and drawings. It should be understood that the specific embodiments described here are only intended to illustrate the present application, but not to limit the present application.

The technical solutions of the present application are illustrated by the following specific embodiments.

The FIGURE shows a modular structure of a system level integrated circuit chip of the present application. For illustration purposes, only the parts related to the embodiment are shown. The details are as follows, the integrated circuit chip comprises a fixed logic module 10 and a Programmable Logic Module 20;

The fixed logic module 10 comprises a CPU module 101, a non-volatile memory (NVM) module 102, a high speed data transmission (HSDT) module 103, and an analogue-to-digital (A/D) conversion and/or a digital-to-analogue (D/A) conversion module 104.

It should be noted that the fixed logic module 10 of the system level integrated circuit chip comprises the CPU module 101, the non-volatile memory module 102, the analogue-to-digital conversion and/or a digital-to-analogue conversion module 104 and the high speed data transmission module 103. The circuit of the fixed logic module is permanent which perform one or a group of functions that cannot be changed once produced. The functions of the components in the fixed logic module 10 are fixed, and the fixed logic module 10 is selected according to user requirements.

The Programmable Logic Module 20 comprises a user defined field programmable gate array 201 and a programmable control module 202. The user defined field programmable gate array 201 comprises an IP soft core based on hardware description languages, on-chip Random Access Memory (RAM) 2011, and logical interface 2012;

It should be noted that the logic of the user defined field programmable gate array 201 and the programmable control module 202 of the Programmable Logic Module 20 can be modified through programming, etc., the Programmable Logic Module 20 has a flexible design, being scalable, expandable, upgradable and having the feature that the system's software and hardware are programmable. Among them, the IP soft core is a user defined function module, and the user describes the logical relationship of the hardware system through a hardware description language or a schematic diagram and so on, and converts accurate hardware descriptions into logical relationships between logical units of the user defined field programmable gate array 201 through a development tool to form a Configuration date file. The Configuration date file is then downloaded to the user defined field programmable gate array 201, and a user defined hardware design is implemented in the user defined field programmable gate array 201. The on-chip Random Access Memory 2011 is used as an available memory of the CPU module 101, and the logical interface 2012 is the connection interface of the user defined field programmable gate array 201 and an external chip.

The CPU module 101 is interconnected with the user defined field programmable gate array 201 and the programmable control module 202.

It should be noted that, the CPU module 101 comprises a first connecting interface and a second connecting interface, the first connecting interface of the CPU module 101 is interconnected with the user defined field programmable gate array 201, the second connecting interface of the CPU module 101 is interconnected with the programmable control module 202. Particularly, the first connecting interface of the CPU module 101 is connected with the logical interface 2012 of the user defined field programmable gate array 201 via system control and data bus, the second connecting interface of the CPU module 101 is connected with the programmable control module 202 via the data bus. The first connecting interface is a port for data transmission by the CPU module 101, and the second connecting interface is a debug port of the CPU module 101 for partial program. As a computing control part of the system level integrated circuit chip, the CPU module 101 of the present application is capable of fetching instructions, executing instructions, and exchanging information with external memory and logic components.

The non-volatile memory is interconnected with the user defined field programmable gate array 201 and the programmable control module 202;

It should be noted, the non-volatile memory module 102 comprising a first connecting interface and a second connecting interface, the first connecting interface of the non-volatile memory module 102 is connected with the user defined field programmable gate array 201, and the second connecting interface of the non-volatile memory module 102 is connected with the programmable control module 202. Among them, the first connecting interface of the non-volatile memory module 102 is connected with the logical interface 2012 of the user defined field programmable gate array 201, the second connecting interface of the non-volatile memory module 102 is connected with the programmable control module 202 via data bus and address bus, the programmable control module 202 reads and writes data to the non-volatile memory module 102 through the data bus and address bus and the corresponding control signals.

The analogue-to-digital conversion and/or the digital-to-analogue conversion module 104 are connected with the user defined field programmable gate array 201;

It should be noted that the analogue-to-digital conversion and/or the digital-to-analogue conversion module 104 comprise external pins, through which the analogue-to-digital conversion and/or the digital-to-analogue conversion module 104 are connected to pins of other devices outside the chip. The external pin is a structure provided by the analogue-to-digital conversion and/or the digital-to-analogue conversion module 104, through which data of external device is received or sent. Meanwhile, the analogue-to-digital conversion and/or the digital-to-analogue conversion module 104 is connected with the logical interface 2012 of the user defined field programmable gate array 201, receiving or sending data of the user defined field programmable gate array 201 and converting data of the user defined field programmable gate array 201 or received by external pin. Data conversion includes analogue-to-digital conversion or digital-to-analogue conversion, and the converted data is sent to the user defined field programmable gate array 201 or the external pin. In addition, the analogue-to-digital conversion and/or the digital-to-analogue conversion module 104 receives data and generates a control signal to the analogue-to-digital/digital-analogue module, the conversion result is output or shifted before serial output into data bus, the analogue-to-digital and/or the digital-to-analogue conversion result is outputted upon completion of the communication function for the CPU module 101 to read, the analogue-to-digital conversion and/or the digital-to-analogue conversion module 104 receives the data of the CPU module 101, initializes data bus and writes to memory.

The high speed data transmission module 103 is connected with the user defined field programmable gate array 201.

It should be noted that, the high speed data transmission module 103 comprises an external pin, through which the high speed data transmission module 103 is connected to pins of other devices outside the chip. The external pin is a structure provided by the high speed data transmission module 103, through which data of external device is received or sent. Particularly, the high speed data transmission module 103 is connected with the logical interface of the user defined field programmable gate array 201 via system control and data bus and transmits data. Through the programmable gate array, bus control logic can be formed according to user need to connect the CPU module 101 with the non-volatile memory module 102 and the on-chip Random Access Memory 2011. System on Chip (SOC) can be formed by connecting other hard core modules, such as ADC or a variety of soft cores formed by the programmable gate array.

Further, as a preferred embodiment of the present application, the IP soft core is a function module that generate user designed hardware description language into corresponding object file, and transmits codes to the user defined field programmable gate array 201 by way of burning.

Further, as a preferred embodiment of the present application, the high speed data transmission module 103 is at least one of USB2.0/3.0 (Universal Serial Bus) interfaces, HDMI (High Definition Multimedia Interface) interfaces, Display Port interfaces, or MIPI (Mobile Industry Processor Interface) interfaces.

Particularly, the high speed data transmission module comprises one or more interfaces, which comprises USB2.0/3.0 interfaces, HDMI interfaces, Display Port interfaces, and MIPI interfaces. An interface or multiple interfaces are set according to user need, USB2.0/3.0 synchronizes read and write operation at full speed and transmit data quickly; HDMI transmit data quickly and is a digital video/audio interface technology. Transmission through HDMI interfaces allowing the simultaneous transmission of audio and video signals without the need for analogue-to-digital or digital-analogue conversion prior to signal transmission. Display Port interface transmits external video signal, and high-definition audio support is included, meanwhile higher resolution and refresh rate are supported. Standardizes interfaces inside a mobile device, such as camera, display, baseband, radiofrequency interface, etc. by MIPI interface, can improve design flexibility while reducing cost, design complexity, power consumption and EMI. Different interfaces can transmit different signal data, chip external data, audio signals, video signals, image signals and the like can be transmitted by the high speed data transmission module 103.

Further, as a preferred embodiment of the present application, the user defined field programmable gate array 201 is connected with the CPU module 101 via system control and data bus; the on-chip Random Access Memory 2011 of the user defined field programmable gate array 201 saves external programming data and performs real-time control of the user defined field programmable gate array 201, the logical interfaces 2012 provide connecting interfaces for the user defined field programmable gate array 201 and other external modules.

It should be noted, the other external modules refer to the CPU module 101, the non-volatile memory module 102, the programmable control module 202 and the high speed data transmission module 103. The logical interface 2012 of the user defined field programmable gate array 201 is connected with bus of the CPU module 101 via system control, the logical interface 2012 is connected with internal function modules of the user defined field programmable gate array 201, wherein the function modules comprises the on-chip Random Access Memory 2011 and other function modules defined by the IP soft core. The user defined field programmable gate array 201 controls the connection of input unit, output unit with pins of the other external modules according to the configuration data of the on-chip Random Access Memory 2011; In the present application, the user defined field programmable gate array 201 provides connecting interface for interconnection of external function modules.

Further, as a preferred embodiment of the present application, the CPU module 101 is single-core or multi-core, the CPU module 101 is connected with the user defined field programmable gate array 201 via system control and data bus.

It should be noted, the CPU module 101 is single-core or multi-core according to user need. In addition, some part of debugging function of the CPU module 101 is connected with the programmable control module 202, which enable an upper computer to load and debug user code through the programmable control module 202 to the CPU module 101, and the user code is transmitted through download line of the high speed data transmission module 103, and the transmission is completed by the protocol packet. In the present application, the download line of the high speed data transmission module 103 refers to USB interfaces, HDMI interfaces, Display Port interfaces, and MIPI interfaces, etc. The driver of the lower computer and the upper computer is written correspondingly according to the programmable control module 202. The driver of the lower computer of the CPU module 101 comprises hardware management of the interface devices and response to various requests issued by the protocol. The driver of the upper computer comprises interface chip enumeration, address allocation and so on. The central processing of the system operation may change the configuration data to achieve the required functions of the system according to needs. The present application does not limit the model of the CPU module 101.

Further, as a preferred embodiment of the present application, the non-volatile memory module 102 comprises a program logic data unit and a user data unit. The program logic data unit receives programming data through the programmable control module 202, and the user data unit receives user data through the logical interface 2012 of the user defined field programmable gate array 201.

Particularly, the non-volatile memory module 102 comprises the program logic data unit and the user data unit, the programming data is transmitted to the program logic data unit of the non-volatile memory module 102 via the programmable control module 202 according to the connection of non-volatile memory with the programmable control module 202. The user data is sent from the logical interface 2012 of the Programmable Logic Module 20 to the programmable control module 202, and is then sent from the programmable control module 202 to the user data unit of the non-volatile memory module 102.

In addition, the non-volatile memory module 102 serves as an available memory of the CPU module 101, the user stores the user data of the user defined field programmable gate array 201 in the user data unit of the non-volatile memory module 102, which is loaded into the user defined field programmable gate array 201 by power on and initialized. The user may reconfigure the logic modules and function modules in the user defined field programmable gate array 201 to realize the user's logic, the user may also online program to realize the online reconstruction of the system. The non-volatile memory module only allows full erase operation in default state. After the erase operation completes, the non-volatile memory module enters an initial state, and only under the initial state is the operation to the non-volatile memory modules effective.

Further, as a preferred embodiment of the present application, the non-volatile memory module 102 is a Flash Eprom.

It should be noted that the Flash Eprom can still save information after the power is turned off.

Further, as a preferred embodiment of the present application, the programmable control module 202 comprises a Test Access Port.

It should be noted that the Test Access Port of present application refers to a Joint test action group (JTAG) interface, through the JTAG interface, the user defined programmable logic array is configured and partial program of the CPU module 101 is debugged. In addition, in the system level integrated circuit chip, the programmable control module 202 provides a wide range of logic capabilities through programming, and can change programming at any time, thus accomplishes many different functions.

Further, as a preferred embodiment of the present application, the programmable control module 202 reads and writes data to the non-volatile memory module 102 through the data bus and the address bus and the corresponding control signals. The programmable control module 202 is connected with the user defined field programmable gate array 201, which realize random read and write of user defined logic to the user data.

It should be noted that the programmable control module 202 is connected with the logical interface 2012 of the user defined user defined field programmable gate array 201, the logical interface 2012 receives the user data of the user data unit that the programmable control module 202 acquires from the non-volatile memory module 102, and realizes random read and write of user defined logic to the user data. The programmable control module 202 has a JTAG interface, through the JTAG interface, the user defined field programmable gate array 201 is configured, and partial program of CPU is debugged according to the international standard test protocol JTAG. The control system of the programmable control module 202 is expressed in a software language, the software language, included in the programming language of the programmable control module 202, comprises ladder diagrams, statement list, control system flow chart and high-level language, etc.

Further, as a preferred embodiment of the present application, the user defined field programmable gate array 201 interfaces include a universal interface for controlling external devices or circuits.

It should be noted that the universal interfaces of the present application refer to a GPIO interface, which needs to be controlled by the CPU, and some needs the CPU to provide the input signal. The GPIO interface requires at least two registers, a general purpose input output control register for control, and a general purpose input output data register for storing data. Each bit of the data register corresponds to the hardware pin of the GPIO. The direction of data transfer is set by the control register, the data flow of each pin can be set through the control register.

With its special excellent architecture that combines high-performance microprocessors and programmable logic devices, the Non-volatile programmable logic device provided by some embodiments of the present application which support system on chip (SOC) function, provides an effective and convenient solution, dealing with the problem of the combination of a variety of different devices and the integration of the processing capabilities with different applications. The present application provides direct help in opening up new integrated circuit market, ensures more high-speed, more flexible and lower-power information transmissions among integrated circuits in various applications. The present application improves the flexibility of user design, and achieves the goal of reducing power consumption, reducing physical interfaces, high-speed transmission and reducing the interconnection cost between integrated circuits.

Those of ordinary skill in the art should be aware that in combination with the modules and software design steps of the examples described in the embodiments disclosed herein, the present application can be implemented by electronic hardware or a combination of computer software and electronic hardware. Whether these functions are implemented by hardware or software depends on the specific application and design constraints of the technical solutions. A person skilled in the art may use different methods to implement the described functions for each particular application, but such implementation should not be considered as beyond the scope of the present application.

The above embodiments are merely intended for describing the technical solutions of the present application, but not for limiting the present application. Although the present application is described in detail with reference to the foregoing embodiments, it should be understood by those skilled in the art that modifications to the technical solutions described in the foregoing embodiments or equivalent replacements to some technical features can still be made. These modifications or replacements that do not make the essence of the corresponding technical solutions depart from the spirit and scope of the technical solutions of the embodiments of the present application should all be included in the protection scope of the present application.

What is claimed is:

1. An integrated circuit (IC) chip configured to process information comprising:
   a field programmable gate array (FPGA), embedded in the IC chip, coupling to an IP soft core operable based on hardware description language describing logical relationships between various configurable logical units of the FPGA such that the logical units are controlled by the hardware description language;
   a central processing unit (CPU) embedded in the IC chip adjacent to the FPGA and configured to process data in accordance with instructions;
   a programmable control module (PCM) embedded in the IC chip adjacent to the FPGA and operable to facilitate communication between the FPGA via a first bus and the CPU via a second bus;
   a non-volatile memory (NVM) embedded in the IC chip disposed adjacent to the FPGA and operable to store data persistently, wherein the NVM is configured to be accessible by the PCM for providing data or configuration data to the FPGA;
   an analogue-to-digital conversion (ADC) embedded in the IC chip disposed adjacent to the FPGA and configured to convert analogue data to digital data which is forwarded to the FPGA; and
   a high speed data transmission (HSDT) module embedded in the IC chip and configured to facilitate communication between an external device and the FPGA utilizing at least one of High Definition Multimedia Interface (HDMI) interface and Display Port interface;
   wherein the CPU includes a first connecting interface and a second connecting interface, the first connecting interface interconnected with the FPGA, the second connecting interface connected with the PCM; and wherein the first connecting interface is a port for data transmission by the CPU, and the second connecting interface is a debug port of the CPU;
   wherein the NVM includes a first NVM connecting interface and a second NVM connecting interface, the first NVM connecting interface connected with the FPGA, and the second connecting interface connected with the PCM.

2. The IC chip of claim 1, wherein the IP soft core is further configured to convert the hardware description language into corresponding object file, and transmits codes to the user defined field programmable gate array to enable the object file to be downloaded thereon, and the logical units of the user defined field programmable gate array implement the logical relationships based on the downloaded objected file.

3. The IC chip of claim 1, wherein the HSDT module is an MIPI interface.

4. The IC chip of claim 1, wherein the FPGA is connected with the CPU via system control and data bus; an on-chip Random Access Memory of the FPGA storages external programming data and performs real-time control of the FPGA, the logical interfaces provide connecting interfaces for the FPGA and other external modules.

5. The IC chip of claim 1, wherein the CPU is single-core or multi-core, the CPU is connected with the FPGA via system control and data bus.

6. The IC chip of claim 1, wherein the non-volatile memory module includes a program logic data unit and a user data unit, wherein program logic data unit receives programming data through the programmable control module, and the user data unit receives user data through the logical interfaces of the FPGA.

7. The IC chip of claim 1, wherein the nonvolatile memory is a Flash EPROM.

8. The IC chip of claim 1, wherein the programmable control module comprising a Test Access Port.

9. The IC chip of claim 1, wherein the programmable control module reads and writes data to the non-volatile memory module through data bus and address bus and corresponding control signals, the programmable control module is connected with the FPGA, wherein a user defined logic of the FPGA is configured to randomly read and write user data.

10. The IC chip of claim 1, wherein the logical interfaces of the FPGA comprise a universal interface, and the universal interface is used for control of external devices or circuits.

11. The IC chip of claim 1, wherein the analogue-to-digital conversion comprises external pins, through which the analogue-to-digital conversion is connected to pins of other devices outside the chip.

12. A chip containing a programmable integrated circuit (PIC) for data processing utilizing embedded processor, volatile memory and non-volatile memory, the PIC comprising:
a field programmable gate array (FPGA) block, embedded in the chip, containing a plurality of configurable logic units able to be selectively programmed to perform one or more user defined logic functions;
a central processing unit (CPU) block, embedded in the chip, fabricated adjacent to the FPGA block in the PIC and configured to processing data via executing instructions, the CPU configured to contain a first CPU connection and a second CPU connection, wherein the first CPU connection is configured to couple to the FPGA block via an FPGA logic interface for data transmission;
a non-volatile memory (NVM) block, embedded in the chip, fabricated adjacent to the FPGA block in the PIC and containing a program logic data unit for storing configuration data and a user data unit for storing user data, wherein the NVM is configured to be accessible for providing the configuration data to the FPGA;
a programmable control module (PCM) block, embedded in the chip, fabricated adjacent to the FPGA block in the PIC and configured to facilitate programming at least a portion of the FPGA block in accordance with configuration data stored in the NVM block; and
a high speed data transmission (HSDT) block embedded in the chip and configured to facilitate communication between an external device and the FPGA utilizing at least one of High Definition Multimedia Interface (HDMI) interface and Display Port interface.

13. The PIC of claim 12, further comprising an analogue-to-digital conversion (ADC) block disposed adjacent to the FPGA and configured to convert analogue data to digital data for facilitating a programming process of FPGA.

14. The PIC of claim 12, further comprising a digital-to-analogue conversion (DAC) block disposed adjacent to the FPGA and configured to convert digital data to analogue data for transmitting user data between the FPGA and external devices.

15. The PIC of claim 12, the HSDT block is configured to transmit data between the FPGA and an external device.

16. The PIC of claim 12, wherein the FPGA includes a random access memory (RAM) for storing at least a portion of the configuration data.

17. The PIC of claim 12, wherein the RAM, coupled to the NVM block via the PCM block, is configured to retrieve at least a portion of the configuration data from the NVM block after power restoration.

18. The PIC of claim 12, wherein the CPU block is coupled to the PCM block via the second CPU connection for facilitating communication between the NVM block and the PCM block.

19. The PIC of claim 12, wherein the PCM block is coupled to the NVM block via a data bus and address bus for facilitating data access to and from the NVM block.

20. The PIC of claim 12, wherein the PCM block is coupled to the CPU block for facilitating debugging user code.

* * * * *